United States Patent [19]

Leiba

[11] Patent Number: 4,630,002
[45] Date of Patent: Dec. 16, 1986

[54] VERY HIGH FREQUENCY OSCILLATOR WITH GYROMAGNETIC RESONATORS

[75] Inventor: René Leiba, Pantin, France
[73] Assignee: Thomson-CSF, Paris, France
[21] Appl. No.: 784,603
[22] Filed: Oct. 4, 1985

[30] Foreign Application Priority Data

Oct. 26, 1984 [FR] France ............... 84 16374

[51] Int. Cl.⁴ .............................................. H03B 5/18
[52] U.S. Cl. ................... 331/96; 331/117 FE; 331/117 D; 331/177 R
[58] Field of Search ............ 331/96, 117 FE, 117 D, 331/117 R, 177 R

[56] References Cited

U.S. PATENT DOCUMENTS 3,339,152 8/1967 Will ........................................ 331/96
3,879,677 4/1975 Arnold ........................ 331/117 D X
4,270,097 5/1981 LeTron et al. ............. 331/117 D X

OTHER PUBLICATIONS

Le Tron et al., "Multioctave FET Oscillators Double Tuned by a Single YIG," 1979 IEEE International Solid-State Circuits Conference, pp. 162, 163.

*Primary Examiner*—Siegfried H. Grimm
*Attorney, Agent, or Firm*—Oblon, Fisher, Spivak, McClelland, & Maier

[57] ABSTRACT

A very high frequency oscillator (4-22 GHz) including field effect transistor and first and second YIG sphere resonators whose reactant frequencies are displaced, which gives the oscillator a wide frequency range. The first YIG sphere is doubly coupled to the source and gate of the transistor, which gives the oscillator good linearity ($\simeq 10^{-3}$) over its frequency range. The second YIG sphere is coupled to the gate by a coupling wire which also couples to the first YIG sphere.

6 Claims, 9 Drawing Figures

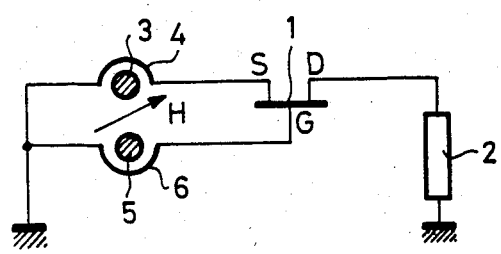
FIG_1
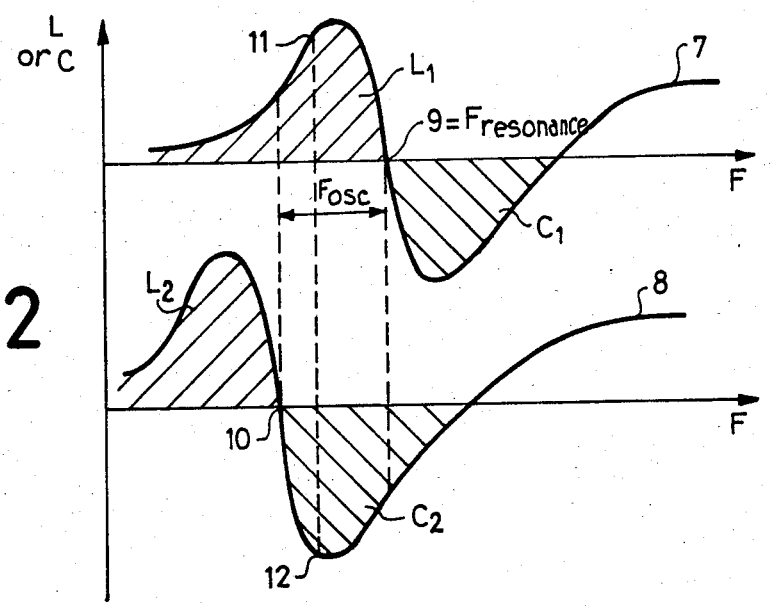
FIG_2
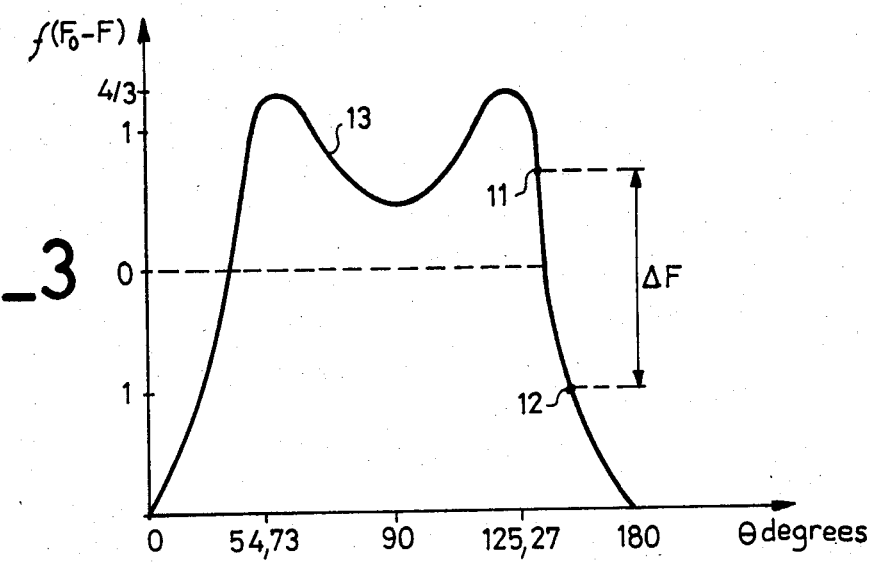
FIG_3

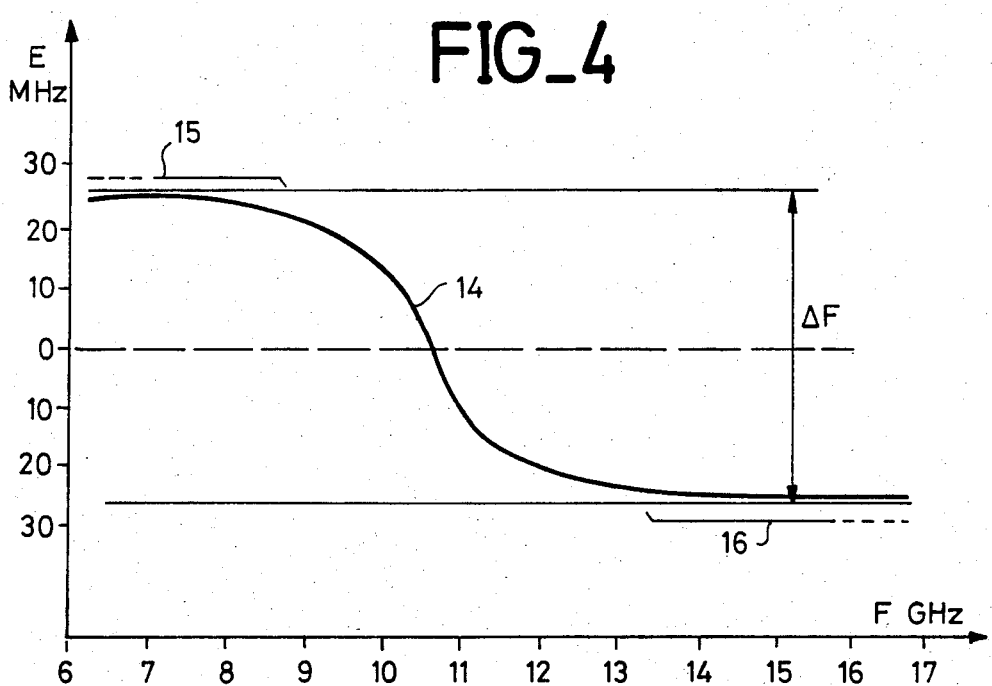
FIG_4
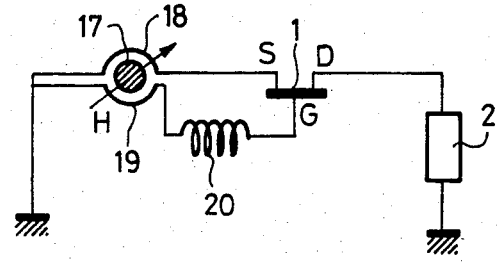
FIG_5
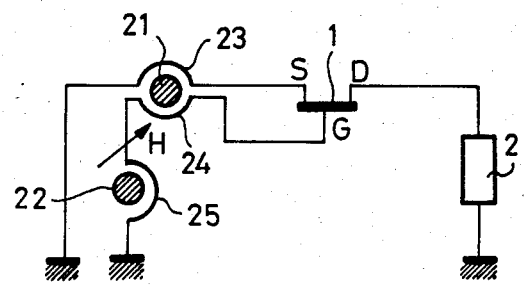
FIG_6

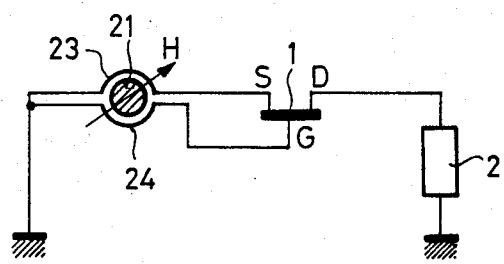
FIG_7
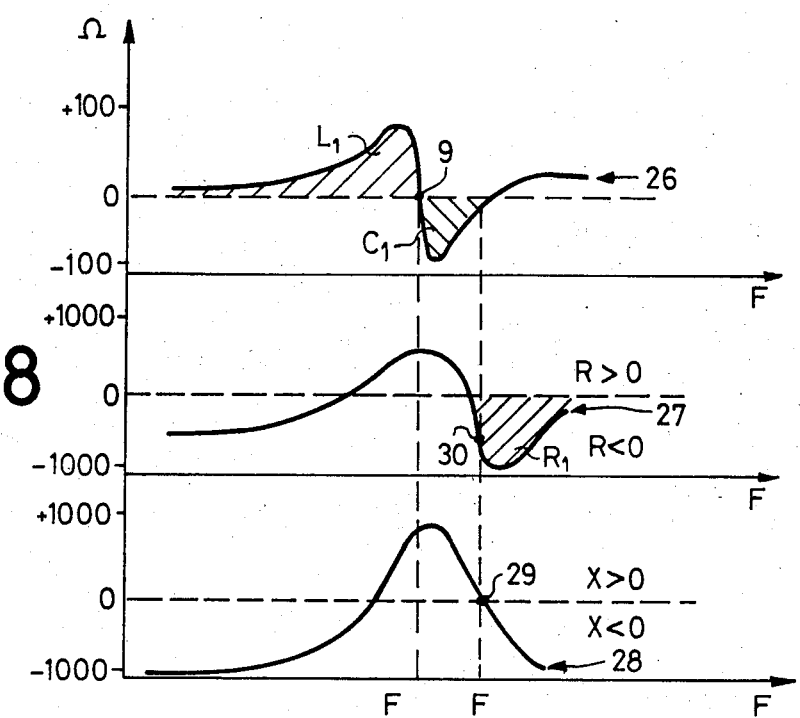
FIG_8
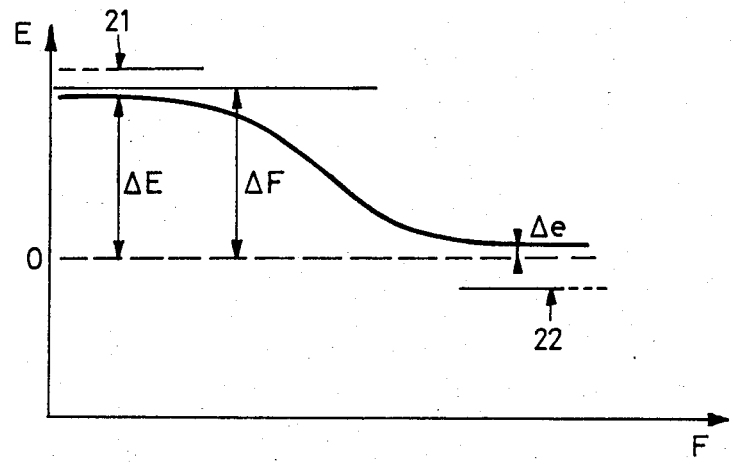
FIG_9

VERY HIGH FREQUENCY OSCILLATOR WITH GYROMAGNETIC RESONATORS

BACKGROUND OF THE INVENTION

The present invention relates to a field effect transistor oscillator, operating at very high frequencies and having two yttrium garnet ball or pellet gyromagnetic resonators, electronically tunable in a very wide frequency range, while having within said range a good linearity of the frequency as a function of the magnetic control field of the resonators. The invention essentially relates to the coupling of the resonators to the gate and source of the field effect transistor.

Oscillators of the three-port type with field effect transistors and gyromagnetic resonators are known, but hitherto they have either had a wide frequency range or a good linearity. As a function of the configurations, the regulations or settings of the yttrium garnet resonator or resonators did not make it possible in known arrangements to improve the frequency range except if a less satisfactory linearity was accepted and vice versa.

The invention obviates this disadvantage by proposing a novel coupling between the resonators and the transistor resulting from the analysis of the operation of each resonator as a function of the frequency. According to the invention, each of them is coupled to the transistor so as to optimize the oscillation state towards the low frequencies for one resonator and towards the high frequencies for the other resonator. The term low and high frequencies is understood to mean, within the scope of the present invention, frequencies such as 4 and 22 GHz. Thus, the oscillator according to the invention has a wide frequency range between 4 and 22 GHz and also a good linearity within this range, whereas the known oscillators only have a range between 7 and 14 GHz for the same tolerance on the frequency linearity as a function of the control field.

The oscillator according to the invention has a field effect transistor, whose drain is loaded by an impedence, e.g. a standardized 50 ohm impedence, whose source is connected to a tuning dipole and whose gate is connected to a reaction dipole relooped on to the source across the tuning dipole. The tuning and reaction dipoles are constituted by iron-yttrium or gallium-yttrium-iron garnet balls or pellets. The first so-called gate ball, whose influence on the frequency preponderates at higher frequencies is coupled by a wire to the gate. The second ball, which is coupled to the source by a wire, has a preponderant influence at lower frequencies. In order to improve the linearity at low frequencies, permitting a greater swing towards the low frequencies, the second ball is doubly coupled, namely to the source by a wire and to the gate by the same wire which already couples the first ball.

SUMMARY OF THE INVENTION

The invention more specifically relates to a very high frequency oscillator having a field effect transistor, whereof the source is connected to a first gyromagnetic resonator dipole, the gate is connected to a second gyromagnetic resonator dipole and the drain is connected to a load impedance, the two gyromagnetic resonators being simultaneously regulatable by the same electrical means, wherein the first resonator is doubly coupled by a first electrical conductor connected to the transistor source and by a second electrical conductor connected to the transistor gate, the second electrical conductor being also doubly coupled to the second resonator.

BRIEF DESCRIPTION OF THE DRAWINGS

The invention is described in greater detail hereinafter relative to non-limitative embodiments and the attached drawings, wherein is shown:

FIG. 1 The circuit diagram of a first oscillator with two resonators according to the prior art.

FIG. 2 A graph showing the oscillation conditions of an oscillator with two resonators.

FIG. 3 A graph showing the influence of the anisotropy of a resonator on the resonant frequency.

FIG. 4 A graph showing the function of each resonator in an oscillator with two resonators.

FIG. 5 A circuit diagram of a second oscillator with a single resonator according to the prior art.

FIG. 6 A circuit diagram of the oscillator with two resonators according to the invention.

FIG. 7 A partial circuit diagram of the oscillator according to the invention, for studying the effect of the double coupling.

FIG. 8 Impedance curves of a doubly coupled resonator and the impedance which it brings on to the drain of the oscillator field effect transistor.

FIG. 9 A graph showing the linearity variation of the oscillator according to the invention.

DETAILED DESCRIPTION OF THE PREFERRED EMBODIMENTS

The invention relates to ultra-high frequency, narrow spectrum electronic oscillators, electronically tunable in a very wide frequency range. Among the electronically tunable ultra-high frequency oscillators are those which are controlled by a voltage and known as VCO, have a very wide frequency range, but their frequency linearity as a function of the control voltage is poor.

Oscillators tunable by gyromagnetic resonators, such as yttrium garnets YIG or gallium-yttrium garnets GaYIG have interesting properties, namely a narrow spectrum, wide frequency band, linearity of the frequency as a function of the magnetic control field H of the gyromagnetic resonator, etc. However, hitherto such oscillators have either had a relatively wide frequency band and a not very satisfactory linearity, or a narrower frequency band and an excellent linearity.

The invention obviates this disadvantage by proposing an oscillator having both a wide frequency band and a good linearity throughout said band. The oscillation frequency of an oscillator is determined by the gyromagnetic resonant frequency of the resonators, which are in the form of small YIG or GaYIG spheres, balls or pellets. In order to simplify the explanations, it is convenient to call the gyromagnetic resonators of the oscillator according to the invention YIG balls. The gyromagnetic resonant frequency F is directly proportional to the steady magnetic field H applied to the balls, in accordance with the relation $$F = aH$$

in which a is the slope of the oscillator.

FIG. 1 shows a YIG ball oscillator, such as is described in U.S. Pat. No. 4,270,097 which corresponds to French patent application Ser. No. 78.06431, filed on Mar. 3, 1978 by applicant's assignee. FIG. 1 does not show the supply circuits of field effect transistor 1, in order to simplify the circuit diagram. This will apply hereinafter for the other circuit diagrams of the oscillators.

The field effect transistor 1 of said oscillator has an output on its drain D, which is loaded by a standardized load 2, which is e.g. resistive at 50 ohms. The tuning dipole is constituted by an yttrium garnet ball 3, coupled by a wire half-loop 4 to the source of the field effect transistor. The reaction dipole is constituted by an yttrium garnet ball 5 coupled by a wire half-loop 6 to the gate of the same field effect transistor 1. The two YIG balls 3, 5 are subjected to the same magnetic field H.

This device oscillates under certain conditions, which are known and which have been established in connection with oscillators with dielectric resonators and for which the main conclusions are that the sum of the resistances brought on to the transistor drain must be equal to or less than 0

$$\Sigma R \leq 0$$

the sum of the reactances brought on to the transistor drain must be zero $$\Sigma X = 0$$

Moreover, and this is shown in FIG. 2 in order that there are oscillations, it is necessary for one resonator to be inductive, while the other is capacitive. As a function of the frequency given on the abscissa, FIG. 2 shows the inductive reactance L or capacitive reactance C of two YIG balls, whose variations are represented by curves 7 and 8. For a first YIG ball, its reactance curve 7 has an inductive part L1 and then, beyond a certain frequency fixed by point 9, a capacitive part C1. In the same way for a second YIG ball corresponding to curve 8, its reactance curve has an inductive part L2 and then, beyond point 10, a capacitive part C2. In order that an oscillator having two YIG balls can function, it is necessary for one ball, e.g. that corresponding to curve 7, to have an inductive reactance L1, while the other ball, namely that corresponding to curve 8 has a capacitive reactance C2. Thus, the two YIG balls are resonant frequency shifted. The oscillating frequency of the oscillator formed in this way is in the frequency range between points 9 and 10, because it is between the abscissas of these points that one resonator is inductive, while the other is capacitive.

If a first YIG ball has a resonant frequency fixed by its position in the magnetic field corresponding e.g. to point 11 on curve 7, it is necessary that the second YIG ball has a resonant frequency corresponding to point 12 of curve 8, point 12 having the same frequency abscissa as point 11.

FIG. 3 shows the anisotropy influence curve of a YIG resonator on the resonant frequency. YIG is an anisotropic material and its resonant frequency is a function of the orientation of its crystal lattice relative to magnetic field H. Thus, FIG. 3 shows the response curve of a YIG resonator, the orientation of its crystal lattice in degrees, relative to the direction of the magnetic field H, being given on the abscissa and a function of the oscillation frequency being given on the ordinate. The response curve 13 is a symmetrical curve, which is readily apparent in view of the fact that during a 180° rotation, the lattice has two symmetrical positions with respect to the field. The frequency band of the oscillator is obtained, as stated in connection with FIG. 2, by displacing the resonances of the two YIG balls with respect to one another. Thus, if a first ball has a resonant frequency regulated on a point 11, the other ball must have a resonant frequency regulated on the complementary point 12, which gives a frequency interval $\Delta F$.

This frequency interval $\Delta F$ between the two YIG balls is particularly necessary towards low frequencies of the order of 6 to 10 GHz. The higher the oscillating frequency becomes, the smaller the said interval. Thus, by appropriately rotating the YIG balls in magnetic field H, $\Delta F$ is reduced between two resonators and consequently the part of the band towards the low frequencies is eliminated, without impairing the high frequencies. Thus, in the configuration of FIG. 1, an oscillator with two YIG balls requires a large resonant frequency interval between the two balls to have an extensive frequency band response.

Furthermore, the linearity curve of the oscillator is a function of this resonant frequency interval $\Delta F$ between the two balls. This is represented in FIG. 4, which shows the function of each resonator in an oscillator having two resonators. The oscillator frequencies in GHz are given on the abscissa and the linearity variation in MHz on the ordinate, i.e. the variation between the control intensity of magnetic field H and the response given by the oscillator, its output frequency.

As the two YIG balls are of the same type, they follow the same linearity law because they are in the same electromagnet, but as a result of their resonant frequency shift, the two lines are translated with respect to one another by $\Delta F$. It will be assumed that the upper line corresponds to the linearity law of the source ball, i.e. the YIG ball coupled to the transistor source and that the lower line corresponds to the linearity law of the gate ball, i.e. the YIG ball coupled to the gate of the same transistor. The arrangement of FIG. 4 can be rendered symmetrical with respect to the dotted line corresponding to a 0 variation, i.e. for which the linearity is absolutely perfect.

For an oscillator with two YIG balls corresponding to a shift $\Delta F$ between the resonant frequencies of the two YIG balls, it can be seen that the linearity curve 14 of said oscillator follows the linearity law of the source ball in region 15 towards the low frequencies and that, as the frequency rises, said linearity curve of the oscillator follows the linearity law of the gate ball towards the high frequencies in region 16. In other words, it is the source ball which controls the linearity of the oscillator towards the low frequencies and the gate ball which controls the linearity of the oscillator towards the high frequencies.

In other words, towards the low frequencies, the gate ball destabilizes the transistor to make it oscillate and the source ball controls the oscillator frequency. Towards the high frequencies, the function of the two balls is reversed, the gate ball controlling the frequency, while the source ball destabilizes the transistor.

In conclusion, an oscillator having two YIG balls in the configuration of FIG. 1 is an oscillator, which can have a relatively wide frequency band up to two octaves, but which only has a mediocre linearity $\Delta F/F$ of approximately $10^2$.

The linearity of an oscillator can be improved when it has the configuration according to FIG. 5, which corresponds to an oscillator with a single YIG ball researched by the applicant.

This oscillator has a field effect transistor 1, whose drain is loaded by an impedance 2, which is e.g. standardized at 50 ohms. Its source is connected to a tuning dipole constituted by a YIG ball 17 coupled to the source by a wire half-loop 18. Its gate is connected to a reaction dipole partly constituted by the same YIG ball 17 coupled by a wire half-loop 19, in series with a relatively large choke 20 in view of the frequencies involved.

Tuning takes place on a single resonator, i.e. a single doubly coupled YIG ball, the frequency response as a function of the field H being linear. The oscillating frequency is slightly before the resonant frequency of the YIG on the inductive part of the reactance curve, as is shown at L1, L2 in FIG. 2. When the resonance frequency increases, the oscillation point drops along said inductive curve to a minimum value, which is determined by the value of the transistor gate choke 20. Consequently the high oscillating frequency is determined by the same choke, but on reducing the latter, the lower oscillating frequency is raised, so that there is a limitation of the operating frequency band of the oscillator.

FIG. 6 shows a simplified circuit diagram of the oscillator according to the invention taking account of the experience acquired by the oscillator with two YIG balls, which has a wide frequency band, but a mediocre linearity and the oscillator with a single YIG ball, which has a limited frequency band, but a good linearity.

The oscillator according to the invention has two YIG balls 21, 22, coupled to the source and the gate of the field effect transistor 1, whose drain is loaded by an impedance 2. Ball 21 is doubly coupled, i.e. it is coupled to the source by a wire half-loop 23, forming a tuning reactance therefrom, while it is coupled to the gate by a wire half-loop 24, which introduces it into the reaction circuit. Ball 22 is coupled by a wire half-loop 25 to the gate of the field effect transistor, but wire 25 is the same as that already coupling the ball 21 by a wire half-loop 24.

Thus, one of the two balls, namely ball 21 is doubly coupled by two wires 23, 24 respectively to the source and gate of the field effect transistor. However, one of the two oscillator wires is doubly coupled at 24 and 25 to the two YIG balls 21, 22 respectively.

The analysis of the operation of this oscillator according to the invention will be facilitated by the study of the operation of the single ball 21, whose diagram is given in FIG. 7. It is immediately apparent from the latter, by comparison with FIG. 6, that the second ball 22 is eliminated and that consequently there is no influence thereof on the oscillator operation.

FIG. 8 shows the impedance curves of the doubly coupled resonator, i.e. YIG ball 21 of FIG. 7. The abscissa of FIG. 8 gives the frequencies and the ordinate the impedance, i.e. the reactance or resistance as a function of the curves and details will be given hereinafter.

The upper curve 26 of FIG. 8 represents the reactance of the YIG ball 21, in accordance with what was stated relative to FIG. 2. This YIG ball has a positive, inductive reactance represented by the curved part L1 which is greater than 0 and a capacitive part C1, which is less than 0 and which consequently corresponds to a negative reactance. Point 9 to which curve 26 passes by a 0 reactance corresponds to the resonant frequency of the YIG ball.

The median curve 27 is the resistance curve brought on to the drain D of field effect transistor 1 by the YIG ball. This resistance curve has a negative part, then a positive part and finally a reversal point with a negative part R1, when the frequency increases.

Finally the lower curve 28 represents the reactance curve X brought on drain D of field effect transistor 1 by the doubly coupled YIG ball 21.

It is pointed out that a condition which has to be satisfied for a device to oscillate is that the sum of the resistances is negative and that the sum of the reactance is zero. Curve 28 representing the reactance brought on to the drain is cancelled out twice, but there is only one point 29 at which the sum of the reactance X is zero and consequently corresponds to the sum of the negative resistances R1 at point 30, which also corresponds to a negative reactance of the YIG ball on curve 26.

Thus, with a doubly coupled ball as in FIG. 7, tuning takes place after the resonance of the ball, but this doubly coupled ball leads to a negative resistance, without it being useful to place a large choke in the gate circuit, as was the case in FIG. 5. Thus, the doubly coupled ball serves the same function as the source ball, but it generates a lower frequency negative resistance.

To return to FIG. 6, ball 21 consequently acts as the source ball and controls the frequency of the oscillator in the lower frequency range, while ball 22 serves as the gate ball and controls the frequencies of the oscillator in the higher frequency range.

FIG. 9 shows the linearity variation curve of the oscillator according to the invention and is like FIG. 8 but the scales are not the same, because this is an objective of the invention.

It was stated hereinbefore that, to obtain a wide band, it is necessary to have a large $\Delta F$. The more $\Delta F$, i.e. the resonance interval between the two balls is increased and the more the frequency is decreased, the less satisfactory the linearity.

In FIG. 9, the linear law line of the gate ball, i.e. ball 22 is taken as a reference line for the linearity variations of the oscillator. At the high frequencies, gate ball 22 controls the oscillator and imposes the frequency, the $\Delta e$ variation on the linearity being very small. At the low frequencies the doubly coupled source ball 21 controls the oscillator. However, on the one hand the latter ball generates a lower frequency negative resistance and consequently widens the frequency band and on the other hand, in view of the fact that at the low frequency it alone controls the oscillator and is doubly coupled, it provides the oscillator with a good linearity in the lower frequency range, which is broader than in an oscillator with one or two balls according to the prior art.

The interval $\Delta F$ between the resonant frequencies of the two balls 21, 22 is large and makes it possible to extend the frequency band, but the linearity variation $\Delta E$ in the lower frequencies remains very small.

For example, whereas the prior art oscillator of FIG. 1 had a frequency band between 4 and 22 GHz and a linearity of $10^{-2}$, i.e. $\pm 50$ MHz to 10 GHz, the oscillator according to the invention of FIG. 6 has a frequency band between 4 and 22 GHz and a linearity variation of $\pm 10$ MHz.

It is obvious that the invention which has been described relative to a field effect transistor can be applied to other three-port semi-conductor devices and that the YIG balls can be replaced by GaYIG balls, or by gyromagnetic resonators without passing outside the scope of the invention.

The oscillator according to the invention is used in ultra-high frequency equipment.

What is claimed is:

1. A very high frequency oscillator having a field effect transistor, whereof the source is connected to a first gyromagnetic resonator dipole, the gate is connected to a second gyromagnetic resonator dipole and the drain is connected to a load impedence, the two gyromagnetic resonators being simultaneously regulatable by the same electrical means, wherein the first resonator is doubly coupled by a first electrical conductor connected to the transistor source and by a second electrical conductor connected to the transistor gate, the second electrical conductor being also doubly coupled to the second resonator.

2. An oscillator according to claim 1, wherein at least one of the gyromagnetic resonators is a monocrystalline magnetic material sphere.

3. An oscillator according to claim 2, wherein the monocrystalline magnetic material is an yttrium-iron garnet YIG or a gallium-yttrium-iron garnet GaYIG.

4. An oscillator according to claim 1, wherein the first doubly coupled resonator constitutes the source resonator of the oscillator which, in the low frequency band, follows the linearity and frequency law of the first resonator.

5. An oscillator according to claim 1, wherein the second resonator coupled to the gate constitutes the gate resonator of the oscillator which, in the high frequency band, follows the linearity and frequency law of said second resonator.

6. An oscillator according to claim 1, wherein the two resonators are coupled to the transistor by means of conductor wire half-loops passing round the gyromagnetic resonators.

* * * * *